United States Patent
Uno

(10) Patent No.: US 10,067,422 B2
(45) Date of Patent: Sep. 4, 2018

(54) PHOTOSENSITIVE RESIN COMPOSITION FOR FORMING INTERLAYER INSULATING FILM, INTERLAYER INSULATING FILM, AND METHOD FOR FORMING INTERLAYER INSULATING FILM

(71) Applicant: TOKYO OHKA KOGYO CO., LTD., Kawasaki-shi (JP)

(72) Inventor: Kazuhide Uno, Kawasaki (JP)

(73) Assignee: TOKYO OHKA KOGYO CO. LTD., Kawasaki-Shi (JP)

( * ) Notice: Subject to any disclaimer, the term of this patent is extended or adjusted under 35 U.S.C. 154(b) by 0 days.

(21) Appl. No.: 15/329,940

(22) PCT Filed: Aug. 12, 2015

(86) PCT No.: PCT/JP2015/072855
§ 371 (c)(1),
(2) Date: Jan. 27, 2017

(87) PCT Pub. No.: WO2016/031580
PCT Pub. Date: Mar. 3, 2016

(65) Prior Publication Data
US 2017/0255099 A1 Sep. 7, 2017

(30) Foreign Application Priority Data
Aug. 27, 2014 (JP) .................. 2014-173129

(51) Int. Cl.
| G03F 7/004 | (2006.01) |
| G03F 7/023 | (2006.01) |
| G03F 7/075 | (2006.01) |
| G03F 7/40 | (2006.01) |
| G03F 7/039 | (2006.01) |
| G03F 7/16 | (2006.01) |
| G03F 7/20 | (2006.01) |
| G03F 7/32 | (2006.01) |
| G03F 7/022 | (2006.01) |

(52) U.S. Cl.
CPC .......... *G03F 7/0755* (2013.01); *G03F 7/0046* (2013.01); *G03F 7/022* (2013.01); *G03F 7/039* (2013.01); *G03F 7/0751* (2013.01); *G03F 7/162* (2013.01); *G03F 7/168* (2013.01); *G03F 7/2004* (2013.01); *G03F 7/322* (2013.01); *G03F 7/40* (2013.01)

(58) Field of Classification Search
CPC ...... G03F 7/0755; G03F 7/0046; G03F 7/022; G03F 7/40; G03F 7/322; G03F 7/168; G03F 7/162; G03F 7/2004
See application file for complete search history.

(56) References Cited

U.S. PATENT DOCUMENTS

2015/0024173 A1    1/2015 Tahara et al.

FOREIGN PATENT DOCUMENTS

| JP | A-2006-301365 | 11/2006 |
| JP | A-2007-031511 | 2/2007 |
| JP | A-2007-033518 | 2/2007 |
| JP | A-2008-040183 | 2/2008 |
| JP | A-2009-282312 | 12/2009 |
| JP | A-2010-134311 | 6/2010 |
| JP | 2011-022509 A * | 2/2011 |
| JP | A-2011-180472 | 9/2011 |
| WO | WO 2013/118680 A1 | 8/2013 |

OTHER PUBLICATIONS

English translation of JP, 2011-022509, A (2011) from machine translation from AIPN Japan Patent Office National Center for Industrial Property Information and Training, generated Sep. 26, 2017, 48 pages.*
International Search Report in International Application No. PCT/JP2015/072855, dated Nov. 22, 2015.
Written Opinion of the International Search Authority in International Application No. PCT/JP2015/072855, dated Nov. 22, 2015.

* cited by examiner

*Primary Examiner* — Cynthia Hamilton
(74) *Attorney, Agent, or Firm* — Knobbe Martens Olson & Bear LLP

(57) ABSTRACT

A photosensitive resin composition for forming an interlayer insulating film, which contains an alkali-soluble resin (A), a photosensitizer (B), a thermal acid generator (T) which generates an acid when heated, and a silane coupling agent (C), and wherein the alkali-soluble resin (A) has a constituent unit (A1) represented by general formula (a-1) or an alicyclic epoxy group-containing unit (A3). In general formula (a-1), R represents a hydrogen atom or a methyl group; and $Ra^{01}$ represents a hydrogen atom or an organic group having a hydroxyl group.

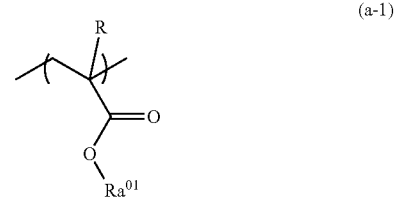

(a-1)

8 Claims, No Drawings

PHOTOSENSITIVE RESIN COMPOSITION FOR FORMING INTERLAYER INSULATING FILM, INTERLAYER INSULATING FILM, AND METHOD FOR FORMING INTERLAYER INSULATING FILM

TECHNICAL FIELD

The present invention relates to a photosensitive resin composition for forming an interlayer insulating film, an interlayer insulating film, and a method for forming an interlayer insulating film.

Priority is claimed on Japanese Patent Application No. 2014-173129, filed on Aug. 27, 2014, the content of which is incorporated herein by reference.

BACKGROUND ART

In recent years, high integration and an increase in size of a semiconductor element have been advanced, and a package substrate is required to be further thinner and smaller. Accordingly, a surface protective layer of the semiconductor element, an interlayer insulating film, or an interlayer insulating film of the package substrate including a rewiring layer is required to be formed by a material having excellent electrical properties, heat resistance, mechanical properties and the like in combination.

A polyimide resin (hereinafter, referred to as "PI") or polybenzoxazole (hereinafter, referred to as "PBO") is a representative of the material which is able to satisfy the above required properties, and for example, use of a photosensitive PI or a photosensitive PBO, in which photosensitive properties have been imparted to PI or PBO, has been reviewed. If these photosensitive resins are used, there is an advantage in that a pattern formation step is simplified and a complicated manufacture step can be reduced. Furthermore, since the photosensitive resins have high heat resistance or insulation resistance compared to a conventional vinyl-based photosensitive resin which can be developed in alkali due to the introduction of a carboxyl group, the photosensitive resins are effective as the interlayer insulating film (for example, refer to PTLs 1 and 2).

On the other hand, the photosensitive PI or the photosensitive PBO has a problem in that the resins need to be baked at high temperature (350° C. to 400° C.); exposure stability is not satisfactory; film shrinkage of the formed resin film is great; and solubility in a solvent is low.

In contrast, an interlayer insulating film using a photosensitive alkali resin with high heat resistance and excellent handleability has been suggested (PTL 3). However, various lithography properties of this interlayer insulating film using this photosensitive alkali resin still need to be improved.

CITATION LIST

Patent Literature

[PTL 1] Japanese Unexamined Patent Application, Publication No. 2011-180472
[PTL 2] Japanese Unexamined Patent Application, Publication No. 2007-031511
[PTL 3] Japanese Unexamined Patent Application, Publication No. 2008-040183

SUMMARY OF INVENTION

Technical Problem

The present invention has been made in view of the aforementioned circumstances and an object thereof is to provide a photosensitive resin composition from which an interlayer insulating film with satisfactory lithography properties can be formed.

Solution to Problem

According to a first aspect of the present invention, there is provided a photosensitive resin composition for forming an interlayer insulating film including: an alkali-soluble resin (A) including a structural unit (A1) represented by general formula (a-1) or an alicyclic epoxy group-containing unit (A3); a photosensitizer (B); a thermal acid generator (T) which generates an acid when heated; and a silane coupling agent (C).

According to a second aspect of the present invention, there is provided an interlayer insulating film using the photosensitive resin composition for forming an interlayer insulating film of the first aspect.

According to a third aspect of the present invention, there is provided a method for forming an interlayer insulating film including: a step of forming a photosensitive resin composition layer using the photosensitive resin composition for forming an interlayer insulating film according to the first aspect on a support; a step of exposing the photosensitive resin composition layer; a step of developing the exposed photosensitive resin composition layer to form an interlayer insulating film pattern; and a step of heating and curing the interlayer insulating film pattern.

Advantageous Effects of Invention

According to the present invention, it is possible to provide a photosensitive resin composition from which an interlayer insulating film with satisfactory lithography properties can be formed.

DESCRIPTION OF EMBODIMENTS

Hereinafter, an embodiment of the present invention will be described in detail, but the present invention is not limited to the embodiment described below. Appropriate modification can be added within the range of the object of the present invention to execute the invention.

<Photosensitive Resin Composition for Forming an Interlayer Insulating Film>

A photosensitive resin composition for forming an interlayer insulating film of the present embodiment (hereinafter, simply referred to as "photosensitive resin composition") includes an alkali-soluble resin (A) including a structural unit (A1) represented by general formula (a-1) or an alicyclic epoxy group-containing unit (A3); a photosensitizer (B); a thermal acid generator (T) which generates an acid when heated; and a silane coupling agent (C).

<<Alkali-Soluble Resin (A)>>

An alkali-soluble resin (A) (hereinafter, may be referred to as "copolymer (A)") includes a structural unit (A1) represented by the following general formula (a-1) or an alicyclic epoxy group-containing unit (A3).

[Structural Unit (A1)]

The structural unit (A1) is represented by the following general formula (a-1).

[Chemical formula 1]

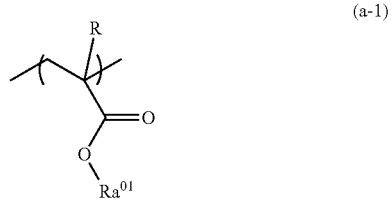

(a-1)

In the formula, R represents a hydrogen atom or a methyl group; and $Ra^{01}$ represents a hydrogen atom or an organic group having a hydroxyl group.

In general formula (a-1), R represents a hydrogen atom or a methyl group.

In general formula (a-1), $Ra^{01}$ represents a hydrogen atom or an organic group having a hydroxyl group.

Examples of the organic group include a branched, linear, or cyclic alkyl group, an aryl group which may have a substituent, a heteroaryl group which may have a substituent, an aralkyl group which may have a substituent, and a heteroaralkyl group which may have a substituent. $Ra^{01}$ has at least one hydroxyl group in the structure thereof. The carbon number of the organic group is preferably 1 to 20 and more preferably 6 to 12. If a carbon number is large, it is preferable from a standpoint of obtaining storage stability or a low dielectric constant of an interlayer insulating layer and if a carbon number is small, resolution is excellent.

As the structural unit (A1), in a case where $Ra^{01}$ is a hydrogen atom, in other words, selection of a methacrylic acid or an acrylic acid is effective in order to increase the developing properties of a copolymer in alkali, but from a standpoint of storage stability, as the structural unit (A1), an organic group having a hydroxyl group for $Ra^{01}$ is preferably adopted.

Preferred examples of the structural unit (A1) include a structural unit represented by the following general formula (a-1-1).

[Chemical formula 2]

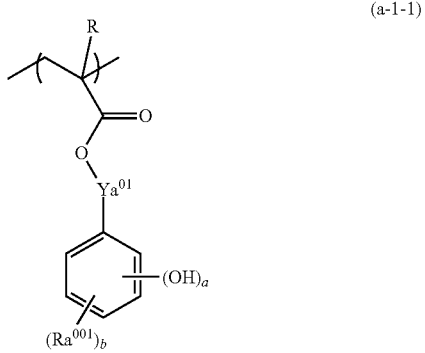

(a-1-1)

In the formula, R represents a hydrogen atom or a methyl group; $Ya^{01}$ represents a single bond or an alkylene group having 1 to 5 carbon atoms; $Ra^{001}$ represents an alkyl group having 1 to 5 carbon atoms; a represents an integer of 1 to 5; b represents an integer of 0 or 1 to 4; and a+b is 5 or less.

In a case where two or more $Ra^{001}$'s exist, these $Ra^{001}$'s may be the same or different from each other.

In general formula (a-1-1), R represents a hydrogen atom or a methyl group, and a methyl group is preferable.

In addition, $Ya^{01}$ represents a single bond or a linear or branched alkylene group having 1 to 5 carbon atoms. Specific examples thereof include a methylene group, an ethylene group, a propylene group, an isopropylene group, an n-butylene group, an isobutylene group, a tert-butylene group, a pentylene group, an isopentylene group, and a neopentylene group. Among these, a single bond, a methylene group, or an ethylene group is preferable.

$Ya^{01}$ is preferably a single bond, from a standpoint of being able to enhance alkali solubility and enhancing heat resistance when the resin composition is made into an interlayer insulating film.

Here, a represents an integer of 1 to 5, and a is preferably 1 from a standpoint of obtaining the effect of the present invention and achieving easy production. Also, the bonding position of the hydroxyl group in a benzene ring is preferably $4^{th}$ position, when a carbon atom bonded to $Ya^{01}$ is set as a standard ($1^{st}$ position).

$Ra^{001}$ represents a linear or branched alkyl group having 1 to 5 carbon atoms. Specific examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable from a standpoint of achieving easy production.

Here, b represents an integer of 0 or 1 to 4, and b is preferably 0 from a standpoint of obtaining the effect of the present invention and achieving easy production Furthermore, specific examples of the structural unit (A1) include a structural unit derived from o-hydroxyphenyl (meta)acrylate, m-hydroxyphenyl(meta)acrylate, p-hydroxyphenyl(meta)acrylate, o-hydroxybenzyl(meta)acrylate, m-hydroxybenzyl(meta)acrylate, p-hydroxybenzyl (meta)acrylate, o-hydroxyphenyl ethyl(meta)acrylate, m-hydroxyphenyl ethyl(meta)acrylate, p-hydroxyphenyl ethyl(meta)acrylate. A structural unit derived from p-hydroxyphenyl(meta)acrylate or p-hydroxybenzyl(meta)acrylate is preferable and a structural unit derived from p-hydroxyphenyl(meta)acrylate is particularly preferable.

The content proportion of the structural unit (A1) in the copolymer (A) is preferably 10 to 70 mol %, more preferably 15 to 60 mol %, and most preferably 20 to 50 mol % with respect to the total structural units constituting the copolymer (A).

[Alicyclic Epoxy Group-Containing Unit (A3)]

The alicyclic epoxy group-containing unit (A3) is not particularly limited as long as the structural unit has an alicyclic epoxy group in the structure and is derived from a compound having an ethylenic double bond. The carbon number of the alicyclic group of the alicyclic epoxy group is preferably about 5 to 10. Since the copolymer (A) has the alicyclic epoxy group-containing unit (A3), heat resistance of the photosensitive resin composition can be enhanced without adding a low molecular weight crosslinking component, which causes generation of an outgas, to the photosensitive resin composition.

Specific examples of the alicyclic epoxy group-containing unit (A3) include a structural unit derived from each alicyclic epoxy group-containing polymerizable unsaturated compound represented by the following general formulae (1) to (31).

[Chemical formula 3]
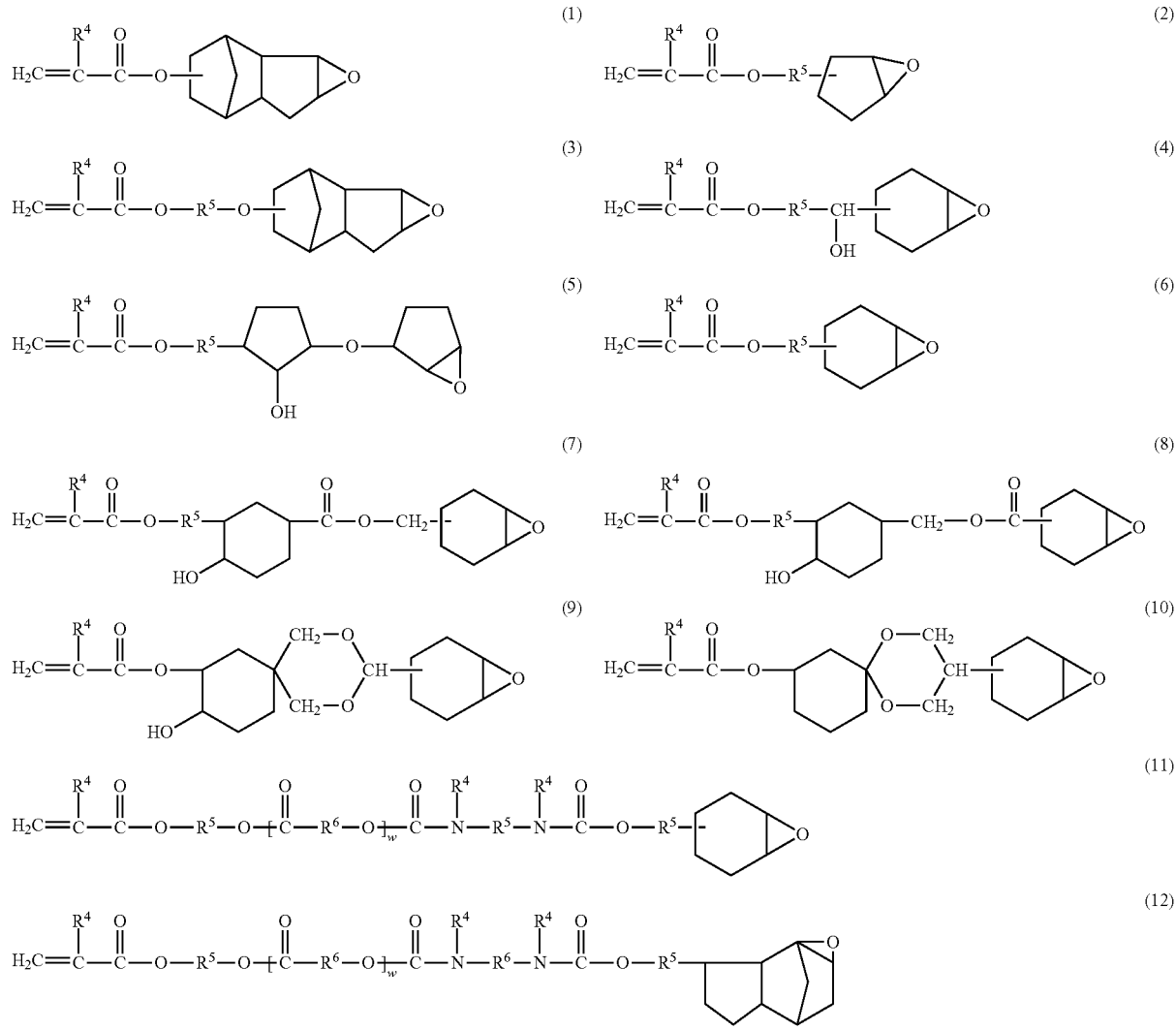
[Chemical formula 4]
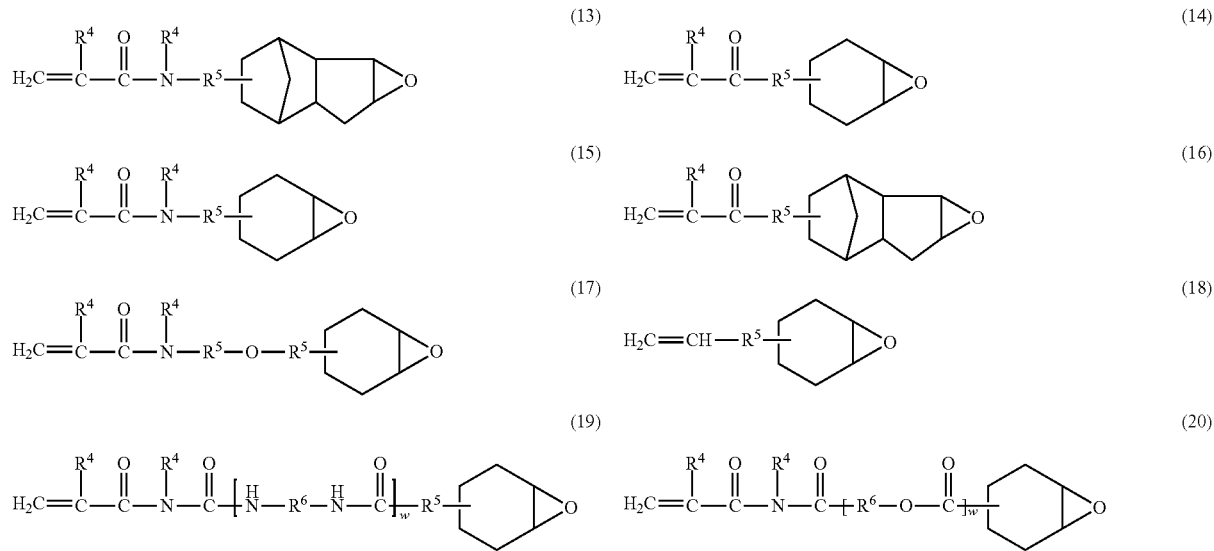

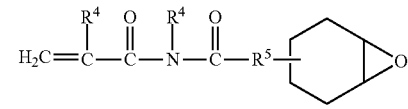
(21)

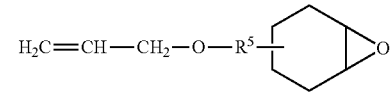
(22)

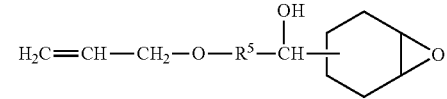
(23)

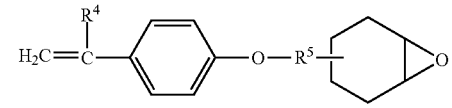
(24)

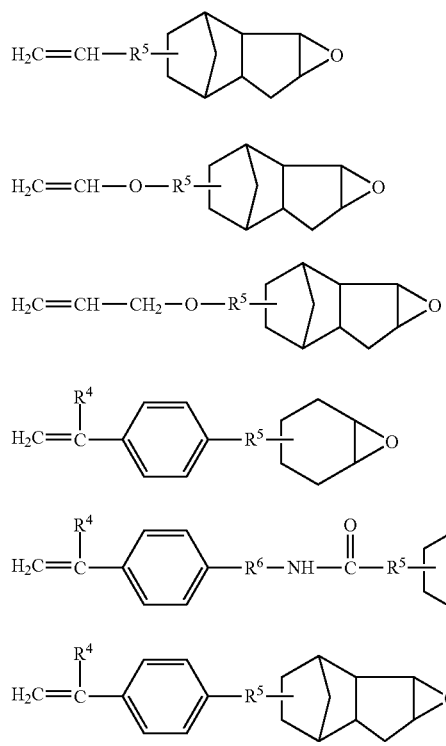

(25)

(26)

(27)

(28)

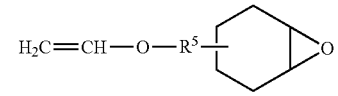
(29)

(30)

(31)

In the formulae, $R^4$ represents a hydrogen atom or a methyl group, $R^5$ represents a divalent hydrocarbon group having 1 to 8 carbon atoms, $R^6$ represents a divalent hydrocarbon group having 1 to 20 carbon atoms, $R^4$, $R^5$, and $R^6$ may be the same or different from each other, and w represents an integer of 0 to 10.

Among these, the structural unit represented by general formulae (1) to (6), (14), (16), (18), (21), (23) to (25), or (30) is preferable. Each of the structural units represented by general formulae (1) to (6) is more preferable.

The content proportion of the alicyclic epoxy group-containing unit (A3) in the copolymer (A) is preferably 5 to 40 mol %, more preferably 10 to 30 mol %, and most preferably 15 to 25 mol %, with respect to the total structural units constituting the copolymer (A). Furthermore, if the content proportion thereof is 10 mol % or more, heat resistance or adhesiveness of the interlayer insulating film can be increased, and if the content proportion thereof is less than 40 mol %, a dielectric constant of the interlayer insulating film can be suppressed to be low.

[Structural Unit (A2)]

Also, the copolymer (A) preferably has a structural unit (A2) represented by the following general formula (a-2).

[Chemical formula 5]

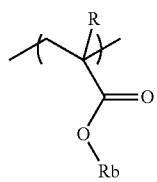
(a-2)

In the formula, R represents a hydrogen atom or a methyl group; and Rb represents a hydrocarbon group.

Examples of the hydrocarbon group for Rb include a branched, linear, or cyclic alkyl group, an aryl group which may have a substituent, or an aralkyl group which may have a substituent.

The carbon number of the hydrocarbon group is preferably 1 to 20. Furthermore, the carbon number of the branched or linear alkyl group is preferably 1 to 12 and most preferably 1 to 6.

The carbon number of the cyclic alkyl group is preferably 6 to 20 and most preferably 6 to 12. The carbon number of the aryl group which may have a substituent or the aralkyl group which may have a substituent is preferably 6 to 20 and most preferably 6 to 12.

If the carbon number is 20 or less, alkali resolution is sufficient, and if the carbon number is 1 or more, a dielectric constant of the interlayer insulating film can be reduced, which is preferable.

Specific examples of the structural unit (A2) include a structural unit derived from linear or branched alkyl acrylate such as methyl acrylate, ethyl acrylate, propyl acrylate, isopropyl acrylate, butyl acrylate, amyl acrylate, ethyl hexyl acrylate, octyl acrylate, and t-octyl acrylate; alicyclic alkyl acrylate such as cyclohexyl acrylate, dicyclopentanyl acrylate, 2-methyl cyclohexyl acrylate, and isobornyl acrylate; benzyl acrylate, or aryl acrylate (for example, phenyl acrylate).

Alternatively, specific examples thereof include a structural unit derived from linear or branched alkyl methacrylate such as methyl methacrylate, ethyl methacrylate, propyl methacrylate, isopropyl methacrylate, n-butyl methacrylate, sec-butyl methacrylate, t-butyl methacrylate, amyl methacrylate, hexyl methacrylate, and octyl methacrylate; alicyclic alkyl methacrylate such as cyclohexyl methacrylate, dicyclopentanyl methacrylate, 2-methyl cyclohexyl methacrylate, and isobornyl methacrylate; benzyl methacrylate, aryl methacrylate (for example, phenyl methacrylate, or cresyl methacrylate, naphthyl methacrylate, or the like).

Introduction of the structural unit (A2) into the copolymer (A) enables an adjustment of a dissolution speed of the copolymer. As the structural unit (A2), a structural unit derived from a monomer having an alicyclic group is particularly preferable from a standpoint of obtaining a low dielectric constant of the interlayer insulating film.

The content proportion of the structural unit (A2) in the copolymer (A) is preferably 5 to 50 mol % with respect to the total structural units constituting the copolymer (A).

[Structural Unit (A4)]

Also, the copolymer (A) may include a structural unit (A4) other than the structural units (A1) to (A3) within the range not against the object of the present invention. The structural unit (A4) is not particularly limited as long as the structural unit is derived from a compound having an ethylenic double bond. Examples of the structural unit (A4) include a structural unit derived from a compound selected from acrylamides, methacrylamides, allyl compounds, vinyl ethers, vinyl esters, and styrenes.

Specific examples of the acrylamides include acrylamide, N-alkyl acrylamide (an alkyl group preferably has 1 to 10 carbon atoms and examples thereof include a methyl group, an ethyl group, a propyl group, a butyl group, a t-butyl group, a heptyl group, an octyl group, and a cyclohexyl group), N-aryl acrylamide (examples of an aryl group include a phenyl group, a tolyl group, a nitrophenyl group, a naphthyl group, and a hydroxyphenyl group), N,N-dialkyl acrylamide (the alkyl group preferably has 1 to 10 carbon atoms), N,N-aryl acrylamide (examples of the aryl group include a phenyl group), N-methyl-N-phenyl acrylamide, N-hydroxyethyl-N-methyl acrylamide, N-2-acetamide ethyl-N-acetyl acrylamide.

Specific examples of the methacrylamides include methacrylamide, N-alkyl methacrylamide (an alkyl group preferably has 1 to 10 carbon atoms and examples thereof include a methyl group, an ethyl group, a t-butyl group, an ethyl hexyl group, and a cyclohexyl group), N-aryl methacrylamide (examples of an aryl group include a phenyl group), N, N-dialkyl methacrylamide (examples of the alkyl group an ethyl group, a propyl group, and a butyl group), N,N-diaryl methacrylamide (examples of the aryl group include a phenyl group), N-hydroxyethyl-N-methyl methacrylamide, N-methyl-N-phenyl methacrylamide, N-ethyl-N-phenyl methacrylamide.

Specific examples of the allyl compound include allyl esters (for example, allyl acetate, allyl caproate, allyl caprylate, allyl laurate, allyl palmitate, allyl stearate, allyl benzoate, allyl acetoacetate, allyl lactate, or the like) allyl oxyethanol.

Specific examples of the vinyl ethers include alkyl vinyl ether (for example, hexyl vinyl ether, octyl vinyl ether, decyl vinyl ether, ethyl hexyl vinyl ether, methoxyethyl vinyl ether, ethoxyethyl vinyl ether, chloroethyl vinyl ether, 1-methyl-2,2-dimethyl propyl vinyl ether, 2-ethyl butyl vinyl ether, hydroxyethyl vinyl ether, diethylene glycol vinyl ether, dimethyl aminoethyl vinyl ether, diethyl aminoethyl vinyl ether, butyl aminoethyl vinyl ether, benzyl vinyl ether, tetrahydrofurfuryl vinyl ether, or the like), vinyl aryl ether (for example, vinyl phenyl ether, vinyl tolyl ether, vinyl chlorophenyl ether, vinyl-2,4-dichlorophenyl ether, vinyl naphthyl ether, vinyl anthranilether, or the like).

Specific examples of the vinyl esters include vinyl butyrate, vinyl isobutyrate, vinyl trimethyl acetate, vinyl diethyl acetate, vinyl barate, vinyl caproate, vinyl chloroacetate, vinyl dichloroacetate, vinyl methoxyacetate, vinyl butoxyacetate, vinyl phenyl acetate, vinyl acetoacetate, vinyl lactate, vinyl-β-phenyl butyrate, vinyl benzoate, vinyl salicylate, vinyl chlorobenzoate, vinyl tetrachlorobenzoate, and vinyl naphthoate.

Specific examples of the styrenes include styrene, alkyl styrene (for example, methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene, or the like), alkoxystyrene (for example, methoxystyrene, 4-methoxy-3-methyl styrene, dimethoxystyrene, or the like), and halogen styrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethyl styrene, 4-fluoro-3-trifluoromethyl styrene, or the like). Acrylonitrile and methacrylonitrile can be also exemplified.

As the aforementioned another structural unit, a structural unit derived from a monomer having an alicyclic group is preferably selected from a standpoint of decreasing a dielectric constant of the interlayer insulating film.

In the embodiment, the copolymer (A) preferably includes the structural units (A1), (A2), and (A3).

The mass average molecular weight (Mw: a value measured by gel permeation chromatography (GPC) in terms of polystyrene) of the copolymer (A) is preferably 2,000 to 50,000 and more preferably 5,000 to 30,000. If the molecular weight is 2,000 or more, the resin composition can be formed into a film shape easily. In addition, if the molecular weight is 50,000 or less, appropriate alkali solubility can be obtained.

The copolymer (A) can be produced by conventionally known radical polymerization. That is, a polymerizable monomer which derives the structural units (A1) to (A3) and a conventionally known radical polymerization initiator are dissolved in a polymerization solvent, and then heated and stirred, thereby producing the copolymer (A).

Furthermore, the alkali-soluble resin (A) may include one or more types of another copolymer, in addition to the copolymer including the structural units (A1) to (A3). The content of this copolymer is preferably 0 to 50 parts by mass and more preferably 0 to 30 parts by mass with respect to 100 parts by mass of the aforementioned copolymer (A). The mass average molecular weight (Mw: a value measured by gel permeation chromatography (GPC) in terms of polystyrene) of this copolymer is preferably 2,000 to 50,000 and more preferably 5,000 to 30,000.

<<Photosensitizer (B)>>

The photosensitizer (B) is not particularly limited as long as it is a compound which can be used as a photosensitive component, and preferred examples thereof include a quinone diazide group-containing compound.

Specific examples of the quinone diazide group-containing compound include a completely esterified product or a partially esterified compound of a phenolic compound (also referred to as a phenolic hydroxyl group-containing compound) and a naphthoquinone diazide sulfonic acid compound.

Specific examples of the phenolic compound include polyhydroxybenzophenones such as 2,3,4-trihydroxybenzophenone, 2,3,4,4'-tetrahydroxybenzophenone; a trisphenol-type compound such as tris(4-hydroxyphenyl)methane, bis (4-hydroxy-3-methyl phenyl)-2-hydroxyphenyl methane, bis(4-hydroxy-2,3,5-trimethyl phenyl)-2-hydroxyphenyl methane, bis(4-hydroxy-3,5-dimethyl phenyl)-4-hydroxyphenyl methane, bis(4-hydroxy-3,5-dimethyl phenyl)-3-hydroxyphenyl methane, bis(4-hydroxy-3,5-dimethyl phenyl)-2-hydroxyphenyl methane, bis(4-hydroxy-2,5-dimethyl phenyl)-4-hydroxyphenyl methane, bis(4-hydroxy-2,5-dimethyl phenyl)-3-hydroxyphenyl methane, bis(4-hydroxy-2,5-dimethyl phenyl)-2-hydroxyphenyl methane, bis(4-hydroxy-3,5-dimethyl phenyl)-3,4-dihydroxyphenyl methane, bis(4-hydroxy-2,5-dimethyl phenyl)-3,4-dihydroxyphenyl methane, bis(4-hydroxy-2,5-dimethyl phenyl)-2,4-dihydroxyphenyl methane, bis(4-hydroxyphenyl)-3-methoxy-4-hydroxyphenyl methane, bis(5-cyclohexyl-4-hydroxy-2-methylphenyl)-4-hydroxyphenyl methane, bis(5-cyclohexyl-4-hydroxy-2-methyl phenyl)-3-hydroxyphenyl methane, bis(5-cyclohexyl-4-hydroxy-2-methylphenyl)-2-hydroxyphenyl methane, bis(5-cyclohexyl-4-hydroxy-2-methyl phenyl)-3,4-dihydroxyphenyl methane, and 4,4'-[(3,4-dihydroxyphenyl)methylene]bis(2-cyclohexyl-5-methyl phenol);

A linear polyphenolic compound including a linear 3 nucleus phenol compound such as 2,4-bis(3,5-dimethyl-4-hydroxybenzyl)-5-hydroxyphenol and 2,6-bis(2,5-dimethyl-4-hydroxybenzyl)-4-methyl phenol; a linear 4 nucleus phenolic compound such as 1,1-bis[3-(2-hydroxy-5-methyl benzyl)-4-hydroxy-5-cyclohexyl phenyl]isopropane, bis[2,5-dimethyl-3-(4-hydroxy-5-methyl benzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methyl phenyl]methane, bis[3-(3,5-dimethyl-4-hydroxybenzyl)-4-hydroxy-5-ethyl phenyl]methane, bis[3-(3,5-diethyl-4-hydroxybenzyl)-4-hydroxy-5-methyl phenyl]methane, bis[3-(3,5-diethyl-4-hydroxybenzyl)-4-hydroxy-5-ethyl phenyl]methane, bis[2-hydroxy-3-(3,5-dimethyl-4-hydroxybenzyl)-5-methyl phenyl]methane, bis[2-hydroxy-3-(2-hydroxy-5-methyl benzyl)-5-methyl phenyl]methane, bis[4-hydroxy-3-(2-hydroxy-5-methyl benzyl)-5-methyl phenyl]methane, and bis[2,5-dimethyl-3-(2-hydroxy-5-methyl benzyl)-4-hydroxyphenyl] methane; and a linear 5 nucleus phenolic compound such as 2,4-bis[2-hydroxy-3-(4-hydroxybenzyl)-5-methyl benzyl]-6-cyclohexyl phenol, 2,4-bis[4-hydroxy-3-(4-hydroxybenzyl)-5-methyl benzyl]-6-cyclohexyl phenol, and 2,6-bis[2,5-dimethyl-3-(2-hydroxy-5-methyl benzyl)-4-hydroxybenzyl]-4-methyl phenol;

A bisphenolic compound such as bis(2,3,-trihydroxyphenyl)methane, bis(2,4-dihydroxyphenyl)methane, 2,3,4-trihydroxyphenyl-4'-hydroxyphenyl methane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl) propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethyl phenyl)propane; a polynuclear branched compound such as 1-[1-(4-hydroxyphenyl)isopropyl]-4-[1,1-bis(4-hydroxyphenyl)ethyl]benzene and 1-[1-(3-methyl-4-hydroxyphenyl)isopropyl]-4-[1,1-bis(3-methyl-4-hydroxyphenyl) ethyl]benzene; and a condensed-type phenolic compound such as 1,1-bis(4-hydroxyphenyl)cyclohexane. These may be used alone or two or more thereof in combination.

In addition, as the naphthoquinone diazide sulfonic acid compound, naphthoquinone-1,2-diazide-5-sulfonic acid or naphthoquinone-1,2-diazide-4-sulfonic acid can be exemplified.

In addition, examples of another quinone diazide group-containing compound include a nucleus-substituted derivative of orthobenzoquinone diazide, orthonaphthoquinone diazide, orthoanthraquinone diazide, or orthonaphthoquinone diazide sulfonates. Furthermore, a reaction product of orthoquinone diazide sulfonyl chloride and a compound having a hydroxyl group or an amino group (for example, phenol, p-methoxyphenol, dimethyl phenol, hydroquinone, bisphenol A, naphthol, pyrocatechol, pyrogallol, pyrogallol monomethyl ether, pyrogallol-1,3-dimethyl ether, a gallic acid, an esterified or etherified gallic acid with a part of the hydroxyl group remained, aniline, p-aminodiphenylamine, or the like) can be used. These may be used alone or two or more thereof in combination.

For example, the trisphenolic compound and naphthoquinone-1,2-diazide-5-sulfonyl chloride, or naphthoquinone-1,2-diazide-4-sulfonyl chloride are condensed in a suitable solvent such as dioxane in the presence of alkali such as triethanolamine, alkali carbonate, and alkali hydrocarbonate, and completely or partially esterified, thereby producing these quinone diazide group-containing compounds.

In addition, as the aforementioned component (B), a non-benzophenone-based quinone diazide group-containing compound is preferably used and a polynuclear branched compound is preferably used. In this phenolic hydroxyl group-containing compound, a gram absorbency index at the wavelength of 350 nm is preferably 1 or less. Due to this, in the photosensitive resin composition, even higher sensitivity can be obtained and transmittance (transparency) when the composition is made into an interlayer insulating film can be enhanced. Furthermore, the decomposition temperature of the phenolic hydroxyl group-containing compound is more preferably 300° C. or higher. Due to this, transparency of the interlayer insulating film can be secured.

As this component (B), a quinone diazide group-containing compound is preferable and a naphthoquinone diazide sulfonate compound is particularly preferable. Among these, a naphthoquinone diazide sulfonate compound such as 4,4'-[(3,4-dihydroxyphenyl)methylene]bis(2-cyclohexyl-5-methyl phenol) and 1-[1-(4-hydroxyphenyl)isopropyl]-4-[1,1-bis(4-hydroxyphenyl)ethyl]benzene can be preferably used.

The content of the component (B) is preferably 10 to 40 mass % and more preferably 15 to 30 mass % with respect to the total solid content of the photosensitive resin composition of the embodiment. As the content of the component (B) is set to 10 mass % or more, resolution can be enhanced. Also, the amount of film shrinkage of the formed pattern can be reduced. As the content of the component (B) is set to 40 mass % or less, appropriate sensitivity or transmittance can be imparted.

<<Thermal Acid Generator (T)>>

The photosensitive resin composition for forming an interlayer insulating film of the embodiment contains a thermal acid generator (T).

Since the photosensitive resin composition for forming an interlayer insulating film of the embodiment contains the thermal acid generator (T), it is considered that a polymerization reaction (in particular, polymerization in the epoxy group in the alkali-soluble resin) in the photosensitive resin film is promoted by the action of an acid generated when heated at the time of the heating and curing treatment, and a film density is enhanced.

The thermal acid generator (T) may be appropriately selected from the conventional thermal acid generators to be used, and trifluoromethane sulfonate, a boron trifluoride ether complex compound, hexafluorophosphate, perfluorobutane sulfonate, and a cation-based or proton acid catalyst of boron trifluoride can be used. Among these, hexafluorophosphate, trifluoromethane sulfonate, and perfluorobutane sulfonate are preferable, and trifluoromethane sulfonate is more preferable.

Specific examples thereof include diethyl ammonium trifluoromethane sulfonate, triethyl ammoniumtrifluoromethane sulfonate, diisopropyl ammoniumtrifluoromethane sulfonate, and ethyl diisopropyl ammoniumtrifluoromethane sulfonate. In addition, as an aromatic onium salt used as the acid generator, onium salts which generates cationic species when heated can be used as a thermal cationic polymerization initiator. Examples thereof include San-Aid SI-45, SI-47, SI-60, SI-60L, SI-80, SI-80L, SI-100, SI-100L, SI-110L, SI-145, 1-150, SI-160, SI-180L, SI-B3, and SI-B3A (manufactured by SANSHIN CHEMICAL INDUSTRY CO., LTD.). Other examples thereof include CI-2921, CI-2920, CI-2946, CI-3128, CI-2624, CI-2639, CI-2064 (manufactured by Nippon Soda Co., Ltd.), CP-66, CP-77 (manufactured by ADEKA Corporation), FC-520 (manufactured by 3M Company) K-PURE TAG-2396, TAG-27135, TAG-2713, TAG-2172, TAG-2179, TAG-2168E, TAG-2722, TAG-2507, TAG-2678, TAG-2681, TAG-2679, TAG-2690, TAG-2700, TAG-2710, TAG-2100, CDX-3027, CXC-1615, CXC-1616, CXC-1750, CXC-1738, CXC-1614, CXC-1742, CXC-1743, CXC-1613, CXC-1739, CXC-1751, CXC-1766, CXC-1763, CXC-1736, CXC-1756, CXC-1821, and CXC-1802-60 (manufactured by King Industries Inc.)

Among the above, trifluoromethane sulfonate or hexafluorophosphate is preferable and trifluoromethane sulfonate is more preferable.

In the embodiment, the acid generation temperature of the thermal acid generator (T) is preferably higher than the prebaking temperature and specifically, the temperature of 110° C. or higher is preferable and 130° C. or higher is more preferable.

In addition, if the acid generation temperature of the thermal acid generator (T) is lower than the prebaking temperature, an acid is generated from the thermal acid generator (T) at the time of prebaking and polymerization is advanced in the photosensitive resin film, and accordingly alkali solubility in an exposed area is lowered and an excellent pattern cannot be formed.

Meanwhile, in the case where the acid generation temperature of the thermal acid generator (T) is set to the aforementioned range, in the thermal curing treatment after the photosensitive resin film is formed, since polymerization in the photosensitive resin film can be advanced, it is considered that the film density can be enhanced without hindering the formation of the pattern.

In the embodiment, the content of the thermal acid generator (T) is preferably 0.1 to 1.5 mass %, more preferably 0.1 to 0.8 mass %, and most preferably 0.1 to 0.4 mass % with respect to the total solid content of the photosensitive resin composition.

As the content is set to equal to or less than the upper limit, an influence of light absorption on the thermal acid generator itself is reduced and accordingly, it is considered that light transmittance can be satisfactory and a pattern can be formed excellently.

In addition, as the content is set to equal to or more than the lower limit, the acid generation amount necessary for polymerization is secured and polymerization is advanced. Accordingly, it is considered that a film having a high film density can be formed. As a result, it is considered that chemical resistance of the photosensitive resin film is enhanced. Specifically, for example, excellent resistance can be exhibited with respect to a solvent (for example, PGMEA, PGME, N-methylpyrrolidone (NMP), or the like), an acid (hydrofluoric acid, or the like), or an alkali (TMAH, or the like), which is exposed at the time of being provided in a semiconductor production step.

<<Silane Coupling Agent (C)>>

The photosensitive resin composition for forming an interlayer insulating film of the embodiment contains a silane coupling agent (C). As the photosensitive resin composition for forming an interlayer insulating film of the embodiment contains the silane coupling agent (C), adhesiveness between a film formed by the photosensitive resin composition and a substrate can be enhanced or properties of the film formed by the photosensitive resin composition can be adjusted.

Specific examples of the silane coupling agent (C) include γ-aminopropyl trimethoxysilane, γ-aminopropyl triethoxysilane, γ-glycidoxypropyl trialkoxy silane, γ-glycidoxypropyl alkyl dialkoxysilane, γ-methacryloxypropyl trialkoxysilane, γ-methacryloxypropyl alkyl dialkoxysilane, γ-chloropropyl trialkoxysilane, γ-mercaptopropyl trialkoxysilane, β-(3,4-epoxycyclohexyl)ethyl trialkoxysilane, and vinyl trialkoxysilane. Among these, γ-glycidoxypropyl trialkoxysilane or γ-methacryloxypropyl trialkoxysilane is preferable, γ-glycidoxypropyl trialkoxysilane is more preferable, and 3-glycidoxypropyl trimethoxysilane is particularly preferable. These may be used alone or two or more in combination.

The content of the silane coupling agent (C) is preferably 0.01 to 10 mass %, more preferably 0.1 to 2 mass %, and most preferably 0.2 to 1.5 mass % with respect to the total solid content of the photosensitive resin composition of the embodiment. In the case where the content is within the aforementioned range, adhesiveness between a pattern formed by the photosensitive resin composition and a substrate is enhanced, which is preferable.

<<Crosslinking Agent (D)>>

The photosensitive resin composition for forming an interlayer insulating film of the embodiment further preferably contains a crosslinking agent (D). Also, the crosslinking agent (D) is more preferably at least one selected from the group consisting of an oxetane-containing compound, an epoxy group-containing compound, and a blocked isocyanate compound.

[Oxetane-Containing Compound and Epoxy Group-Containing Compound]

Examples of the oxetane group or epoxy group-containing compound include styrene oxide, phenyl glycidyl ether, o-phenyl phenol glycidyl ether, p-phenyl phenol glycidyl ether, glycidyl cinnamate, methyl glycidyl ether, butyl glycidyl ether, 2-ethyl hexyl glycidyl ether, decyl glycidyl ether, stearyl glycidyl ether, allyl glycidyl ether, glycidol, N-glycidyl phthalimide, 1,3-dibromophenyl glycidyl ether, Celloxide 2000 (manufactured by DAICEL Corporation), and oxetane alcohol.

As a specific example of the oxetane-containing compound, Aron Oxetane OXT-121, OXT-221, OX-SQ, or PNOX (all are manufactured by TOAGOSEI CO., LTD.) can be used.

As a specific example of the epoxy group-containing compound, an epoxy resin EXA4850-150, or an epoxy resin EXA4850-1000 (all are manufactured by DIC Corporation) can be used.

[Blocked Isocyanate Compound]

The blocked isocyanate compound is inactive at room temperature and a compound in which a blocking agent such as oximes, diketones, phenols, and caprolactams is dissociated to reproduce an isocyanate group by being heated. The blockisocyanate compound may be used alone or two or more in combination.

Here, as the isocyanate compound, a conventional isocyanate compound can be used and examples thereof include aliphatic diisocyanate such as hexamethylene diisocyanate, trimethyl hexamethylene diisocyanate, and lysine diisocyanate, alicyclic diisocyanate such as dicyclohexyl methane diisocyanate, isophorone diisocyanate, 1,4-cyclohexane diisocyanate, hydrogenated xylylene diisocyanate, and hydrogenated tolylene diisocyanate, aromatic diisocyante such as tolylene diisocyanate, 4,4'-diphenyl methane diisocyanate, 2,4'-diphenyl methane diisocyanate, naphthalene diisocyanate, xylylene diisocyanate, tolidine diisocyanate, p-phenylene diisocyanate, and naphthylene diisocyanate, dicyclohexylmethane-4,4'-diisocyanate, a biuret product and an isocyanurate product thereof, and an adduct product of trimethylolpropane.

Among these, aliphatic diisocyanate such as hexamethylene diisocyanate and lysine diisocyanate, alicyclic diisocyanate such as dicyclohexyl diisocyanate and isophorone diisocyanate, aromatic diisocyanate such as tolylene diisocyanate, tolidine diisocyanate, xylylene diisocyanate, diphenyl methane diisocyanate, and naphthalene diisocyanate, and a biuret product and an isocyanurate product thereof, and an adduct product of trimethylolpropane are preferable.

Among these, as the adduct product, an adduct of the aliphatic diisocyanate and trimethylolpropane is preferable. As the biuret product, a reactant of hexamethylene diisocyanate and water or trivalent alcohol is preferable. As the isocyanurate product, a trimer of hexamethylene diisocyanate is preferable.

The blocking agent is a compound which is stable at room temperature but is isolated to produce an isocyanate group when heated at the dissociation temperature or higher, in addition to a polyisocyanate group. Specific examples of the blocking agent include a lactam compound such as γ-butyrolactam, ε-caprolactam, γ-valerolactam, and propiolactam, an oxime compound such as methyl ethyl ketooxime, methyl isoamyl ketooxime, methyl isobutyl ketooxime, formamide oxime, acetamide oxime, acetoxime, diacetyl monooxime, benzophenone oxime, and cyclohexanone oxime, monocyclic phenolic compound such as phenol, cresol, catechol, and nitrophenol, polycyclic phenolic compound such as 1-naphthol, an alcohol compound such as methyl alcohol, ethyl alcohol, isopropyl alcohol, tert-butyl alcohol, trimethylolpropane and 2-ethyl hexyl alcohol, an ether compound such as ethylene glycol monomethyl ether, ethylene glycol monoethyl ether, and ethylene glycol monobutyl ether, and an active methylene compound such as malonic acid alkyl ester, malonic acid dialkyl ester, acetoacetic acid alkyl ester, and acetyl acetone. The blocking agent may be used alone or two or more in combination.

The blocked isocyanate compound can be produced by reacting the isocyanate compound and the blocking agent. The reaction between the isocyanate compound and the blocking agent is, for example, performed in a solvent not having an active hydrogen (1,4-dioxane, cellosolve acetate, or the like) by heating at a temperature of about 50° C. to 100° C. in the presence of a blocking catalyst, if necessary. The ratio of the used isocyanate compound and the blocking agent is not particularly limited, and preferably 0.95:1.0 to 1.1:1.0 and more preferably 1:1.05 to 1:1.15, as the equivalent ratio of the isocyanate group and the blocking agent in the isocyanate compound.

A conventional catalyst can be used as the blocking catalyst and examples thereof include metal alcoholate such as sodium methylate, sodium ethylate, sodium phenolate, and potassium methylate, hydroxide of tetraalkyl ammonium such as tetramethyl ammonium, tetraethyl ammonium, and tetrabutyl ammonium, organic weak acid salts thereof such as acetate, octylate, myristate, and benzoate, and alkali metal salts of alkali carboxylic acids such as acetic acid, caproic acid, octylic acid, and myristic acid. The blocking catalyst may be used alone or two or more in combination.

A commercially available product can be used as the blocked isocyanate compound. Specific examples of the commercially available product include TPA-B80E (trade name, manufactured by Asahi Kasei Corporation, isocyanurate-type), 17B-60P (trade name, manufactured by Asahi Kasei Corporation, biuret-type), and E402-B80B (trade name, manufactured by Asahi Kasei Corporation, adduct-type).

The content of the blocked isocyanate compound is preferably 1 to 60 mass %, more preferably 5 to 50 mass %, and most preferably 10 to 40 mass % with respect to the total solid content of the photosensitive resin composition of the embodiment.

In the embodiment, as the crosslinking agent (D), the blocked isocyanate compound is preferably adopted from a standpoint of enhancing mechanical properties of the interlayer insulating film.

Also, among the blocked isocyanate compounds, an adduct-type blocked isocyanate compound is preferably adopted.

In the case where the adduct-type blocked isocyanate compound is adopted, the content of the adduct-type blocked isocyanate compound is preferably 10 to 40 mass % and more preferably 15 to 25 mass % with respect to the total solid content of the photosensitive resin composition of the embodiment.

As the content is within the aforementioned range, heat resistance can be imparted in addition to the improvement of the mechanical properties of the interlayer insulating film.

<<Organic Solvent (S)>>

The photosensitive resin composition according to the embodiment preferably contains an organic solvent (S) in order to improve coating properties and adjust viscosity.

Examples of the organic solvent (S) include benzene, toluene, xylene, methyl ethyl ketone, acetone, methyl isobutyl ketone, cyclohexanone, methanol, ethanol, propanol, butanol, hexanol, cyclohexanol, ethylene glycol, diethylene glycol, glycerol, ethylene glycol monomethyl ether, ethylene glycol monoethyl ether, propylene glycol monomethyl ether (PGME), propylene glycol monoethyl ether, diethylene glycol monomethyl ether, diethylene glycol monoethyl ether, diethylene glycol dimethyl ether, diethylene glycol diethyl ether, 3-methoxybutyl acetate (MA), 3-methoxybutanol (BM), 3-methyl-3-methoxybutyl acetate, propylene glycol monomethylether acetate (PGMEA), propylene glycol monomethyl ether propionate, propylene glycol monoethyl ether propionate, methyl carbonate, ethyl carbonate, propyl carbonate, butyl carbonate, or mixtures thereof. Among these, PGME, PGMEA, MA, or a mixed solvent of PGME and PGMEA, or a mixed solvent of MA and BM are preferably used.

The used amount of the organic solvent (S) is not particularly limited, and appropriately adjusted depending on the thickness of the film to be coated, to the concentration at which the composition is able to be applied to a substrate, or the like. Specifically, the solid content concentration of the photosensitive resin composition preferably is 10 to 50 mass % and particularly preferably used within the range of 15 to 35 mass %.

<<Surfactant (E)>>

The photosensitive resin composition for forming an interlayer insulating film of the embodiment may contain a surfactant (E).

Examples of the surfactant (E) include a silicone-based surfactant or a fluorine-based surfactant. Specifically, as the silicone-based surfactant, BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341v344, BYK-345v346, BYK-348, BYK-354, BYK-355, BYK-356, BYK-358, BYK-361, BYK-370, BYK-371, BYK-375, BYK-380, BYK-390, or the like manufactured by BYK Japan K.K. can be used.

As the fluorine-based surfactant, F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF1132, TF1027SF, TF-1441, TF-1442, or the like manufactured by DIC (DaiNippon Ink&Chemicals) Corporation can be sued, but the surfactant is not limited to these.

Also, the surfactant (E) may be a surfactant other than the above and an anion-based, a cation-based, or a nonion-based compound is exemplified. Specifically, X-70-090 (trade name, manufactured by Shin-Etsu Chemical Co., Ltd.) can be exemplified.

In the case where the surfactant (E) is contained, the content of the surfactant (E) is preferably 0.01 to 10 mass %, more preferably 0.1 to 2 mass %, and most preferably 0.05 to 1 mass % with respect to the total solid content of the photosensitive resin composition of the embodiment. In the case where the surfactant (E) is contained within the aforementioned range, adhesiveness of a pattern formed by the photosensitive resin composition of the embodiment and a substrate is enhanced, which is preferable. In addition, coating properties and flatness are enhanced.

<<Others>>

Also, the photosensitive resin composition according to the embodiment may contain various additives such as a sensitizer and a defoaming agent.

As the sensitizer, a conventionally known sensitizer which is used for a positive-type resist can be used. For example, a compound having a phenolic hydroxyl group and a molecular weight of 1,000 or less is exemplified.

A conventionally known defoaming agent may be used as the aforementioned defoaming agent, and a silicone-based compound and a fluorine-based compound are exemplified.

The photosensitive resin composition according to the embodiment can be prepared, for example, by mixing (dispersing and kneading) the component (A), the component (B), the component (C), and the component (D) using a stirrer such as a roll mill, a ball mill, and a sand mill, and filtering the components using a 5 μm membrane filter if necessary.

<Interlayer Insulating Film>

The interlayer insulating film of the embodiment is obtained by using the photosensitive resin composition for forming an interlayer insulating film.

The interlayer insulating film of the embodiment can be appropriately used as an interlayer insulating film provided for insulating between the wiring disposed in a layering manner in electronic parts such as liquid crystal display elements, integrated circuit device, and solid-state image pickup device.

<Method for Forming an Interlayer Insulating Film>

The method for forming an interlayer insulating film of the embodiment includes a step of forming a photosensitive resin composition layer using the photosensitive resin composition for forming an interlayer insulating film on a support; a step of exposing the photosensitive resin composition layer; a step of developing the exposed photosensitive resin composition layer to form an interlayer insulating film pattern; and a step of heating and curing the interlayer insulating film pattern.

Hereinafter, a method for forming an interlayer insulating film using the photosensitive resin composition according to the embodiment will be described.

First, the photosensitive resin composition according to the embodiment is applied on a support such as a substrate using a spinner, a roll coater, a spray coater, a slit-nozzle coater, or the like and dried to form a photosensitive resin composition layer. Examples of the substrate include a glass plate which includes wiring such as a transparent conductive circuit and, if necessary, a black matrix, a color filter, a polarizing plate, or the like.

As the drying method, for example, any of the following methods may be used, which includes (1) a method of drying at a temperature of 80° C. to 120° C. for 60 to 300 seconds by a hot plate, (2) a method of placing standstill at room temperature for several hours to several days, and (3) a method of putting in a warm air heater or infrared heater for tens of minutes to several hours to remove a solvent. The film thickness of the photosensitive resin composition layer is not particularly limited and preferably about 1.0 to 5.0 μm.

Next, the exposure is performed via a predetermined mask. This exposure is performed by irradiating the composition with active energy rays such as ultraviolet rays and excimer lasers. As the source of these active energy rays, a low pressure mercury vapor lamp, a high pressure mercury vapor lamp, an ultrahigh pressure mercury vapor lamp, a chemical lamp, an excimer laser generating device or the like can be exemplified. The irradiation dose of the energy rays differs depending on the composition of the photosensitive resin composition, and for example, may be about 30 to 2,000 mJ/cm$^2$.

Next, the exposed photosensitive resin composition layer is developed in a developing solution to form a pattern. Examples of the developing solution include an organic alkali aqueous solution such as a tetramethyl ammonium hydroxide (TMAH) aqueous solution and inorganic alkali aqueous solution such as sodium hydroxide, potassium hydroxide, sodium metasilicate, and sodium phosphate. Due to this, it is possible to provide an interlayer insulating film having a desired range.

Finally, the pattern is heated and cured. This heating and curing is preferably performed, for example, under a condition of 300° C. or lower and more preferably under a condition of 250° C. or lower.

EXAMPLES

Hereinafter, the present invention will be described using Examples, but the present invention is not limited to the following Examples.

<Preparation of Photosensitive Resin Composition>

Each component shown in Table 1 was mixed to each other and dissolved in a mixed solvent of PGMEA/PGME=60/40 (mass ratio) to prepare a photosensitive resin composition. The solid content concentration of the photosensitive resin compositions of Examples 1 to 12 and Comparative Example 1 is 40 mass %.

TABLE 1

| | Component (A) | Component (B) | Component (C) | Component (D) | Component (E) |
|---|---|---|---|---|---|
| Example 1 | (A)-1 [83] | (B)-2 [17] | (C)-1 [1] | (T)-1 [1.0] | (E)-1 [0.1] |
| Example 2 | (A)-1 [83] | (B)-2 [17] | (C)-1 [1] | (T)-2 [1.0] | (E)-1 [0.1] |
| Example 3 | (A)-1 [83] | (B)-2 [17] | (C)-1 [1] | (T)-3 [0.5] | (E)-1 [0.1] |
| Example 4 | (A)-1 [83] | (B)-2 [17] | (C)-1 [1] | (T)-3 [0.2] | (E)-1 [0.1] |
| Example 5 | (A)-1 [83] | (B)-2 [17] | (C)-1 [1] | (T)-3 [1.0] | (E)-1 [0.1] |
| Example 6 | (A)-1 [83] | (B)-2 [17] | (C)-1 [1] | (T)-4 [0.5] | (E)-1 [0.1] |
| Example 7 | (A)-1 [83] | (B)-2 [17] | (C)-1 [1] | (T)-4 [0.2] | (E)-1 [0.1] |
| Example 8 | (A)-1 [83] | (B)-2 [17] | (C)-1 [1] | (T)-4 [1.0] | (E)-1 [0.1] |
| Example 9 | (A)-1 [83] | (B)-2 [17] | (C)-1 [1] | (T)-5 [0.5] | (E)-1 [0.1] |
| Example 10 | (A)-1 [83] | (B)-2 [17] | (C)-1 [1] | (T)-5 [0.2] | (E)-1 [0.1] |
| Example 11 | (A)-1 [83] | (B)-2 [17] | (C)-1 [1] | (T)-6 [1.0] | (E)-1 [0.1] |
| Example 12 | (A)-1 [83] | (B)-2 [17] | (C)-1 [1] | (T)-7 [1.0] | (E)-1 [0.1] |
| Comparative Example 1 | (A)-1 [83] | (B)-2 [17] | (C)-1 [1] | — | (E)-1 [0.1] |

Each symbol in Table shown above means as follows. Also, the numerical value within the brackets is a blending amount (parts by mass).

(A)-1: Polymeric compound (A)-1 described below, the mass average molecular weight (Mw) measured by gel permeation chromatography (GPC) in terms of polystyrene is 17,000, and the copolymerization composition ration obtained by $^{13}$C-NMR (ratio (molar ratio) of the structural unit in structural formula) is x/y/z=50/30/20

(B)-2: Compound obtained by reacting 2 moles of naphthoquinone diazide-5-sulfonate to 1 mole of the compound (B)-1 described below (C)-1: Compound (C)-1 described below (T)-1: Thermal cationic polymerization initiator (manufactured by King Industries, Inc., TAG-2678)

(T)-2: Thermal cationic polymerization initiator (manufactured by King Industries, Inc., TAG-2689)

(T)-3: Thermal cationic polymerization initiator (manufactured by King Industries, Inc., TAG-2690)

(T)-4: Thermal cationic polymerization initiator (manufactured by King Industries, Inc., TAG-2700)

(T)-5: Thermal cationic polymerization initiator (manufactured by King Industries, Inc., CXC-1821)

(T)-6: Thermal cationic polymerization initiator (manufactured by King Industries, Inc., CXC-1738)

(T)-7: Thermal cationic polymerization initiator (manufactured by King Industries, Inc., CXC-1802-60)

(E)-1: Silicone-based surfactant (manufactured by BYK Japan K.K., BYK-310)

[Chemical formula 6]

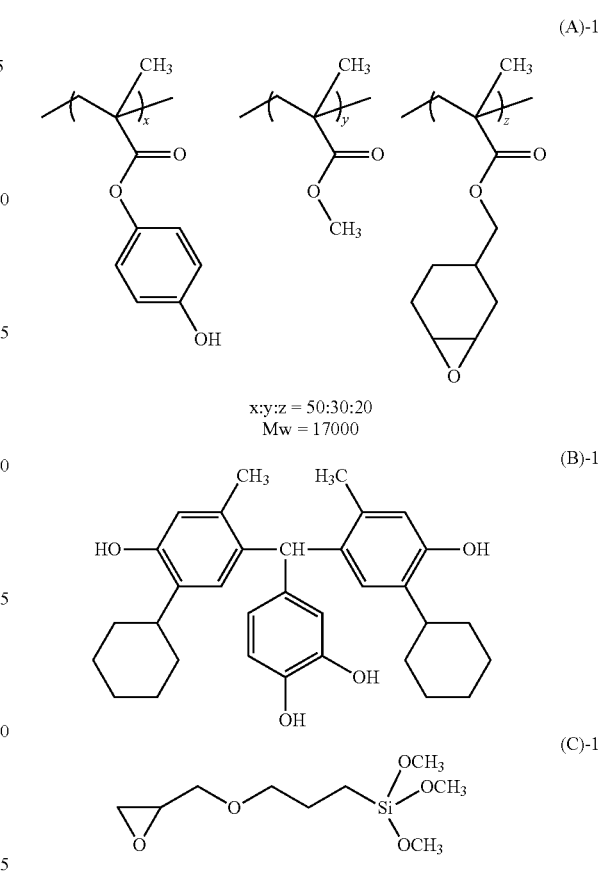

<Formation of Photosensitive Resin Pattern (Interlayer Insulating Film Pattern)>

Each photosensitive resin composition prepared in Examples and Comparative Example was applied to an 8-inch silicon substrate using a spin coater (TR25000: manufactured by TOKYO OHKA KOGYO CO., LTD.) and prebaked at a temperature of 110° C. for 300 seconds to form a coated film having a film thickness of 10 μm (photosensitive resin composition layer).

Next, the coated film was irradiated with ultraviolet rays via a mask using an ultrahigh pressure mercury vapor lamp (ghi-line). The exposure amount was 1,000 mJ/cm$^2$.

The exposed coated film was developed in a 2.38 mass % tetramethyl ammonium hydroxide aqueous solution at a temperature of 23° C. for 60 seconds, and heated and cured at a temperature of 100° C. for 30 minutes, and then at a temperature of 120° C. for 30 minutes, and then at a temperature of 200° C. for 60 minutes to form a photosensitive resin pattern.

<<Evaluation of Film Density>>

[Measurement of Infrared Absorption (IR) Spectrum]

In order to evaluate whether or not the film density is enhanced, which is caused by promotion of polymerization in the photosensitive resin film (coated film) by the heating and curing treatment, an infrared absorption (IR) spectrum was measured after the heating and curing treatment.

According to the IR measurement after the heating and curing treatment, if a peak (in the vicinity of 920 cm$^{-1}$) derived from an epoxy group is lost, it is shown that polymerization by the heating and curing treatment is promoted, in other words, the film density is enhanced. In addition, According to the IR measurement after the heating and curing treatment, if a peak (in the vicinity of 920 cm$^{-1}$) derived from an epoxy group is not lost, it is shown that polymerization by the heating and curing treatment is not promoted.

[Evaluation of Chemical Resistance]

The photosensitive resin pattern formed above was dipped in a mixed solvent of N-methylpyrrolidone and 2% tetramethyl ammonium hydroxide aqueous solution (mixed ratio of 92/8) at a temperature of 40° C. for 15 minutes and whether the photosensitive resin pattern was peeled or not was visually inspected.

In Table 2, the one in which the photosensitive resin pattern was not peeled is described as "Good" and the one in which the photosensitive resin pattern was partially peeled is described as "Poor".

TABLE 2

|  | IR result | Chemical resistance |
| --- | --- | --- |
| Example 1 | Epoxy peak is lost | Good |
| Example 2 | Epoxy peak is lost | Good |
| Example 3 | Epoxy peak is lost | Good |
| Example 4 | Epoxy peak is lost | Good |
| Example 5 | Epoxy peak is lost | Good |
| Example 6 | Epoxy peak is lost | Good |
| Example 7 | Epoxy peak is lost | Good |
| Example 8 | Epoxy peak is lost | Good |
| Example 9 | Epoxy peak is lost | Good |
| Example 10 | Epoxy peak is lost | Good |
| Example 11 | Epoxy peak is lost | Good |
| Example 12 | Epoxy peak is lost | Good |
| Comparative Example 1 | Epoxy peak is not lost | Poor |

As shown in the result described above, in the photosensitive resin film (interlayer insulating film) formed by using the photosensitive resin composition for forming an interlayer insulating film of the embodiment, since the peak derived from an epoxy group after the heating and curing treatment was lost, it is understood that the polymerization reaction was promoted. As a result of the promotion of the polymerization reaction, a resin film with enhanced film density was obtained, and accordingly it is considered that chemical resistance was enhanced as well.

The invention claimed is:

1. A photosensitive resin composition for forming an interlayer insulating film, comprising:
   an alkali-soluble resin (A) including a structural unit (A1) represented by the following general formula (a-1-1), a structural unit (A2) represented by the following general formula (a-2), and an alicyclic epoxy group-containing unit (A3);
   a photosensitizer (B);
   a thermal acid generator (T) which generates an acid when heated; and
   a silane coupling agent (C):

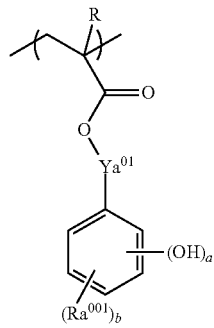

(a-1-1)

wherein R represents a hydrogen atom, or a methyl group; $Ya^{01}$ represents a single bond or an alkylene group having 1 to 5 carbon atoms; $Ra^{001}$ represents an alkyl group having 1 to 5 carbon atoms; a represents an integer of 1 to 5; b represents an integer of 0 or 1 to 4; and a+b is 5 or less, provided that when two or more $Ra^{001}$s are present, they are the same or different from each other

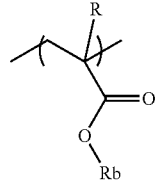

(a-2)

wherein R represents a hydrogen atom or a methyl group; and Rb represents a linear or branched alkyl group.

2. The photosensitive resin composition for forming an interlayer insulating film according to claim 1, wherein an acid generation temperature of the thermal acid generator (T) is 110° C. or higher.

3. The photosensitive resin composition for forming an interlayer insulating film according to claim 1, wherein the thermal acid generator (T) is at least one selected from the group consisting of trifluoromethane sulfonate, a boron trifluoride ether complex compound, hexafluorophosphate, perfluorobutane sulfonate, and a cation-based or proton acid catalyst of boron trifluoride.

4. The photosensitive resin composition for forming an interlayer insulating film according to claim 1, wherein the content of the thermal acid generator (T) is 0.1 to 1.5 mass % with respect to the total solid content of the photosensitive resin composition.

5. The photosensitive resin composition for forming an interlayer insulating film according to claim 1, further comprising:
   a crosslinking agent (D).

6. An interlayer insulating film using the photosensitive resin composition for forming an interlayer insulating film according to claim 1.

7. A method for forming an interlayer insulating film comprising:
   forming a photosensitive resin composition layer using the photosensitive resin composition for forming an interlayer insulating film according to claim 1 on a support;

exposing the photosensitive resin composition layer to an active energy ray;
developing the exposed photosensitive resin composition layer to form an interlayer insulating film pattern; and
heating and curing the interlayer insulating film pattern.

8. The method for forming an interlayer insulating film according to claim 7,
wherein the heating and curing treatment is performed at a temperature of 300° C. or lower.

* * * * *